(12) United States Patent
Moriceau et al.

(10) Patent No.: US 7,476,595 B2
(45) Date of Patent: Jan. 13, 2009

(54) METHOD FOR THE MOLECULAR BONDING OF MICROELECTRONIC COMPONENTS TO A POLYMER FILM

(75) Inventors: Hubert Moriceau, Saint Egreve (FR); Christophe Morales, Pont de Claix (FR); Lea Di Cioccio, Saint Ismier (FR)

(73) Assignee: Commissariat A l'Energie Atomique, Paris (FR)

( * ) Notice: Subject to any disclaimer, the term of this patent is extended or adjusted under 35 U.S.C. 154(b) by 216 days.

(21) Appl. No.: 10/581,111

(22) PCT Filed: Dec. 6, 2004

(86) PCT No.: PCT/FR2004/050656
§ 371 (c)(1),
(2), (4) Date: May 31, 2006

(87) PCT Pub. No.: WO2005/057637
PCT Pub. Date: Jun. 23, 2005

(65) Prior Publication Data
US 2007/0117258 A1    May 24, 2007

(30) Foreign Application Priority Data
Dec. 8, 2003 (FR) .................................. 03 50999

(51) Int. Cl.
*H01L 21/30* (2006.01)
*H01L 21/00* (2006.01)
*H01L 23/02* (2006.01)
*H01L 23/34* (2006.01)

(52) U.S. Cl. ............ 438/455; 438/109; 438/118; 257/685; 257/723; 257/E21.128

(58) Field of Classification Search ............ 438/118, 438/406, 455, 109; 257/685, 723, E21.128
See application file for complete search history.

(56) References Cited

U.S. PATENT DOCUMENTS 4,983,251 A   1/1991   Haisma et al.
5,851,927 A * 12/1998  Cox et al. .................. 438/744

(Continued)

FOREIGN PATENT DOCUMENTS

FR   2 787 919   6/2000
FR   2 796 491   1/2001

OTHER PUBLICATIONS

Tong, Q.-Y. et al., "Semiconductor Wafer Bonding, Science and Technology", The Electrochemical Society Series, Wiley-Interscience, John Wiley and Sons, Inc., New York (1999).

(Continued)

*Primary Examiner*—Scott B. Geyer
*Assistant Examiner*—Seahvosh J Nikmanesh
(74) *Attorney, Agent, or Firm*—Oblon, Spivak, McClelland, Maier & Neustadt, P.C.

(57) ABSTRACT

A method for direct molecular adhesion of an electronic compound (6) on a polymer (4) is described. The polymer (4) is coated with a bonding layer (5), for example silicon oxide, which enables the problems caused by the presence of hydrocarbons to be overcome. The method makes it possible to produce adhesive-free three-dimensional structures (10).

19 Claims, 2 Drawing Sheets

U.S. PATENT DOCUMENTS

| | | | |
|---|---|---|---|
| 6,627,518 B1 * | 9/2003 | Inoue et al. | 438/458 |
| 7,015,570 B2 * | 3/2006 | Emma et al. | 257/685 |
| 7,407,863 B2 * | 8/2008 | Hsieh et al. | 438/406 |
| 2002/0177302 A1 * | 11/2002 | Farrar | 438/652 |
| 2002/0182858 A1 * | 12/2002 | Farrar | 438/652 |
| 2003/0211705 A1 | 11/2003 | Tong et al. | |

OTHER PUBLICATIONS

Moriceau, H. et al., "The Bonding Energy Control: An Original Way To Debondable Substrates", Conference of International Electrochemical Society, Paris, Jun. 2003.

* cited by examiner

METHOD FOR THE MOLECULAR BONDING OF MICROELECTRONIC COMPONENTS TO A POLYMER FILM

TECHNICAL FIELD

The invention relates to the adhesion of microelectronic components on a polymer support.

More specifically, the invention, in one of its aspects, relates to a bonding method so that molecular adhesion is made possible on a surface at least partially coated with a polymer.

In another aspect, the invention relates to a stack of electronic compounds from this method.

PRIOR ART

To produce stacked structures, the adhesion of various levels is often ensured by glues, waxes or even photosensitive polymers: the adhesive substances are generally applied on one or both surfaces to be assembled and a drying or hardening step enables the bonding to be ensured.

In the field of electronics, methods for stacking structures by molecular adhesion are also known. However, in this case, it is systematically recommended to remove the hydrocarbons so as to allow for high-quality bonding (see, for example, the work of Q. Y. Tong and U. Gosele "Semiconductor Wafer Bonding, Science and Technology", John Wiley and Sons, Inc., New York (1999), paragraph 5.4.2).

In addition, a planar surface is preferable for providing durable molecular adhesion. Therefore, polymer films are not favourable for such direct bonding: aside from their significant hydrocarbon content, they have substantial surface porosity.

The development of microelectronics, the miniaturisation of components and the increasing complexity of assemblies has led to the desire to produce three-dimensional structures, in which thick and/or thin chips are stacked on plates of compounds already formed.

In particular, on the initial stack support, electronic components are placed according to conventional methods so as to obtain a host plate. Such methods end up in general by steps making it possible to produce electrical connections, for example, by an application of photosensitive material such as benzocyclobutene (BCB). The photosensitive material present at the surface of the host plate is normally a polymer: the problem is that of being capable of positioning chips or other electronic components at the surface of the polymer in order to produce the three-dimensional structure.

Traditional bonding is not without problems, because any use of glue, polymer, wax, etc. creates an additional thickness that is difficult to manage in such a stack, and has another disadvantage with the possible creation bubbles at the bonding interface. It has also been demonstrated that thin structures bonded to a support via a "thick" adhesive layer had a tendency to become corrugated depending on the nature of the adhesive, the relative thickness, and so on.

DESCRIPTION OF THE INVENTION

The invention proposes, among other advantages, overcoming the aforementioned disadvantages for the adhesion of microelectronic components on polymer surfaces.

The invention proposes using direct molecular adhesion. To this end, the method according to the invention in one of its aspects makes it possible to overcome the problems caused by the presence of the polymer layer, by coating it with a bonding layer allowing for said molecular adhesion. Surprisingly, it was found that the polymer does not contaminate this bonding layer with hydrocarbons: molecular adhesion is therefore achieved in the presence of a polymer, i.e. hydrocarbons, with quality results, contrary to the prejudices of the prior art. The bonding layer advantageously has, on its surface to be assembled, hydrophilic properties obtained spontaneously or after a specific treatment known to a person skilled in the art. In addition, the bonding layer is preferably chemically inert and compatible with subsequent steps routinely implemented in microelectronics. The materials preferred for producing such a bonding layer are oxides, nitrides or a composite layer, in particular $SiO_2$, $Si_xN_y$, $Si_xO_yN_z$. The bonding layer can also consist of a stack of a plurality of the aforementioned layers.

The bonding layer is advantageously polished so as to obtain a planar adhesion surface; depending on the conditions used, such a polishing is possible without any tearing, whether total or partial, of the bonding layer from the polymer, which would lead to contamination by hydrocarbons. Thus, it is not necessary to polish the polymer layer to the same degree, a method that is more difficult to control than the polishing of a silicon oxide layer, for example, or other bonding layer materials.

It is also possible to prepare the bonding layer surface according to methods enabling the adhesion energies to be increased. Also to this end, the method according to the invention advantageously proposes preparing the contact surface of the compound that will be placed on the bonding layer.

It may be preferable to prepare the polymer prior to the deposition of the bonding layer, for example by performing a cross-linking operation. It is also possible to consider consolidating the assembly after molecular adhesion by a heat treatment.

In another aspect, the invention relates to a three-dimensional electronic component structure including a stack, of which some adhesions between successive layers, and more generally between successive levels, are direct, with the deposition of at least one interface layer, of silicon oxide for example.

BRIEF DESCRIPTION OF THE DRAWINGS

The figures of the appended drawings will make it possible to better understand the invention, but are given only by way of indication and are in no way limiting.

DETAILED DESCRIPTION OF PARTICULAR EMBODIMENTS

The invention has a particular application in stacks of electronic, optical, or optoelectronic structures, for example, for producing three-dimensional arrays consisting of plates including components, for example electronic or optical components. These plates can themselves be made up of supports, to which components, possibly different, have been secured and of which the connections have been created. The simplest example, however, relates to a single electronic component, or chip, to be "glued" to the surface of a conventional electronic compound, or host plate.

Figure 1A:
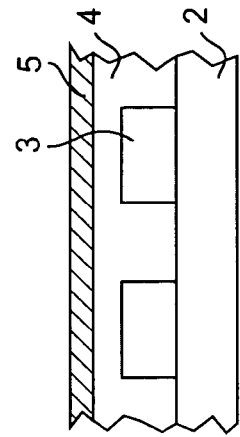
FIGS. 1a to 1d diagrammatically show the various steps of a method according to a preferred embodiment of the invention.

Such a plate 1, shown in FIG. 1a, consists of a support 2, on which various electronic components 3 have been produced according to known techniques. The support 2 is partially coated with a polymer 4, for example, used in one of the steps leading to the electrical connection of the components 3 of the host plate 1, and of which the thickness routinely ranges from 1 to 20 μm, preferably remaining lower than 10 μm; the surface of the host plate 1 can contain, in particular, a BCB film, but a glue or a wax are other possibilities.

For the method according to the invention, it is preferable to prepare the surface polymer 4, in particular to dry it, so as to stabilise it. In particular, it is desirable to perform an additional cross-linking operation on the polymer, for example, by a heat treatment with heating between 150 and 400° C., in one of the final steps of forming the host plate 1. For example, for a BCB film, typically on the order of 6 μm, a heat treatment of 2 h at 250° C. or 300° C., or even 30 min at 350° C., can be envisaged.

Figure 1B:
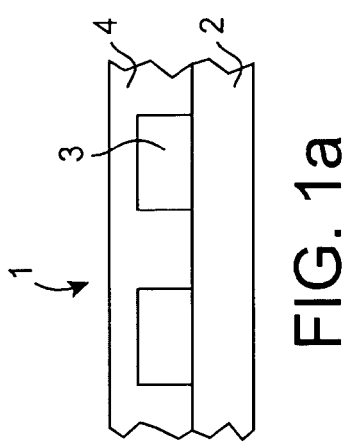

The polymer 4 is then coated with a bonding layer 5, if possible chemically inert and capable of withstanding the usual microelectronics treatments, preferably in the form of a deposited film: FIG 1b. The bonding layer preferably consists of silicon oxide, or it is possible to choose a nitride or a silicon oxynitride; however, it can be made of any material capable of forming a layer that is advantageously hydrophilic (inherently or by a suitable treatment) so as to ensure molecular adhesion. The bonding layer 5 can be uniform, but it can also consist of a superimposition of uniform layers as described above, for example, a $SiO_2$ layer coating a $Si_xO_yN_z$ layer.

If the electronic compound 3 has polymer-free zones 4 on its surface, only the polymer can be coated, but it is easier to coat the entire surface of the plate 1. The silicon oxide 5 or other material can be deposited by known techniques, for example, by a "low-stress" method, at 220° C., for example, or a plasma-enhanced chemical vapour deposition method, at a temperature of 300° C., for example. It is of course desirable for the deposition temperature to be compatible with the aforementioned cross-linking operation. The thickness of the bonding layer 5 produced can be between 50 and 300 nm, preferably on the order of 150 nm; surprisingly, these thicknesses are sufficient for providing a barrier to the hydrocarbons present in the polymer 4. The thickness is chosen in particular so as to be relatively thin to prevent an excessive stiffening effect, but thick enough to allow for subsequent treatments, in particular, for example, the polishing so as to render the surface planar.

Indeed, the surface of the bonding layer 5 is then preferably prepared for bonding. In particular, a polishing step is desirable, so as to obtain a sufficient levelling of the surface and a sufficient microroughness to allow for direct subsequent bonding. The polishing can be performed by a chemical mechanical method, for example, chemical mechanical polishing (CMP) or water polishing on a specific tissue, also known as "slurry cleaning". The polishing also makes it possible to reduce the thickness of the oxide layer to 30 to 150 nm; it is possible, for example, to remove 80 nm of 150 nm. This step, surprisingly, does not cause any tearing, whether partial or total, of the bonding layer 5 that, aside from roughnesses, would cause contamination with hydrocarbons. Simultaneously to the polishing, or as a replacement, the surface can be activated for subsequent molecular adhesion, for example with a mixture of oxygenated water and ammoniac, substantially diluted with water. It is also possible to treat the silicon oxide film with one of the following techniques, alone or in combination: ultraviolet or ozone treatment or any other surface preparation allowing for high adhesion energies such as plasma treatment (under oxygen, argon, nitrogen, hydrogen, etc.).

Figure 1C:
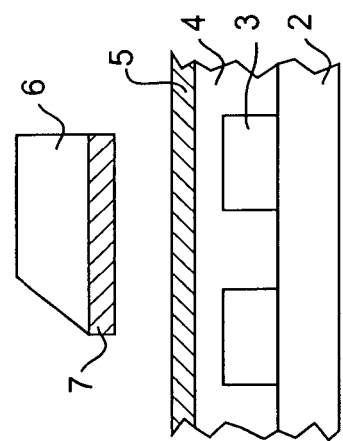

Similarly, to improve the adhesion, the active or inactive surface of the chip 6 (see FIG 1c) which will come into contact with the silicon oxide layer can be cleaned and/or polished and/or subjected to a specific treatment similar to the preparations mentioned for the bonding layer 5. It is also possible to coat it with a polished silicon oxide layer 7 or any other layer similar to the one coating the polymer. It is also possible to perform, using standard techniques known to a person skilled in the art, a treatment enabling the roughness of at least one of the oxide films 5, 7 to be increased in a controlled manner, so as, for example, to allow for a subsequent debonding at the level of this rough surface. Of course, the resulting roughness will be compatible with the molecular bonding (see H. Moriceau et al., "The bonding energy control: an original way to debondable substrates", Conference of International Electro-Chemical Society, Paris, June 2003). This alternative is particularly advantageous in the case of three-dimensional assemblies in which one of the stacked levels is to be removed, for example, after this level has been tested.

Figure 1D:
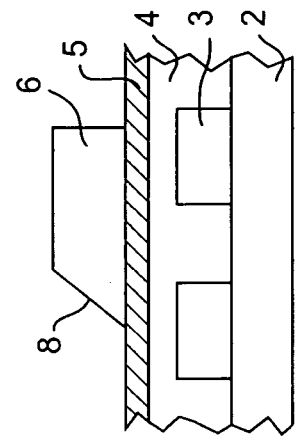

The chip 6 is then preferably bonded directly to the surface of the electronic compound 1 coated with $SiO_2$: FIG 1d. The direct molecular adhesion bonding can be performed on the active surface of the chip, as well as on its inactive surface, depending on the requirements. For more specific information on molecular adhesion, reference can be made to the work of Q. Y. Tong and U. Gosele "Semiconductor Wafer Bonding, Science and Technology", John Wiley and Sons, Inc., New York (1999).

To reinforce the direct bonding, a complementary heat treatment can be performed, for example, a consolidation at temperatures above 100° C.

The method according to the invention therefore allows for bonding between a chip 6 and an electronic compound 1, of which the surface contains a polymer 4, without requiring an additional adhesive substance to be managed; in particular, there is no bead of excess glue on the chip and problems concerning the choice of parameters (nature and form of the glue, spreading of drops, etc.) for preventing the creation of bubbles during bonding are naturally resolved.

In addition, the final bonded structure has a lower and better-controlled thickness than with the use of an adhesive, which adds a thickness that is difficult to predict. Admittedly, an oxide layer 5 is added, but its thickness remains low (in particular much lower than 1 μm) and in any case well controlled.

The low thickness due to the actual bonding (i.e. the thickness of the $SiO_2$ layer resulting from the method, between 30 and 300 nm, for example, and preferably on the order of 50 nm) also enables a step change, located between the chip and the host plate, facilitated for contact on the edges of the chip: it is easy to establish contact between the unbonded surface of the chip and the initial support in this case, where only several micrometers at most (in fact, the thickness of the chip 6) separate them. It may be desirable, in order to further facilitate the step change, to use a bevel 8 on the edges of the chip 6. The bevel 8 can correspond to a profile obtained by etching (for example, by anisotropic chemical etching, sensitive to the crystalline orientation of the bevel planes) or by cleavage (for example, in a preferred crystalline direction: in the case of <100> silicon plates used to produce chips, the cleavage surfaces will be, for example, the <111> planes corresponding to an angle of 54° 7).

In addition, the preparation, and in particular the levelling, of the surface of the host plate prior to bonding, are easier than when an inserted adhesive substance is used: it is possible to leave the surface of the polymer as it is after deposition, in particular if the polymer film has a low thickness, or to perform only one rough polishing operation, with the bonding surface being defined by that of the bonding layer, of which the polishing can be managed and controlled better than for a polymer.

The bonding of chips by molecular adhesion is also more easily controlled, for example in the positioning of the chips, than bonding with an adhesive substance, and all the more so if the chips are thin. Highly thinned chips, or even films, can also be bonded to the BCB coated with an oxide film by transfer: an intermediate support for transferring these chips can be used in the method of the invention. The thinned chip is thus temporarily secured to a support, the surface left free is prepared specifically as described above so as to allow for direct bonding with the final support coated with the polymer and the bonding film. The intermediate support is then detached after the adhesion according to known techniques (see, for example, FR 2 796 491). A significant reduction in the tendency of the transferred elements (chips or films) to become corrugated, or even the removal of this phenomenon, is noted by comparison with the conventional bonding using an adhesive substance.

Another important advantage of the method according to the invention is that it enables the thinning of the chips bonded to the BCB and the oxide film, without any, or almost any, corrugation. If the active surface of the chip was placed in contact for adhesion with the $SiO_2$ layer, most of the back surface of the chip can indeed be removed, by grinding, polishing, chemical attack, debonding, a pedestal removal technique known as "lift off", and so on, so as to leave only a thin film containing the active surface on the bonding interface side.

The description above relates to a chip on an electronic compound plate, but it is clear that a generalisation to any form of electronic compound can be directly derived; the term electronic compound refers to any compound obtained by means conventionally used in microelectronics and capable of having microelectronic, optoelectronic, optical, hyper-frequency applications and so on. With a similar method, the following can in particular be bonded to an "initial support": a monolithic plate, a stacked structure, a developed structure, a film, on the active surface or not, with or without "via holes". Similarly, the "initial support" for bonding must not be limited to the previous example of "electronic compound host plate", but can include the same variety of elements as described above for the bonded element.

Figure 2:
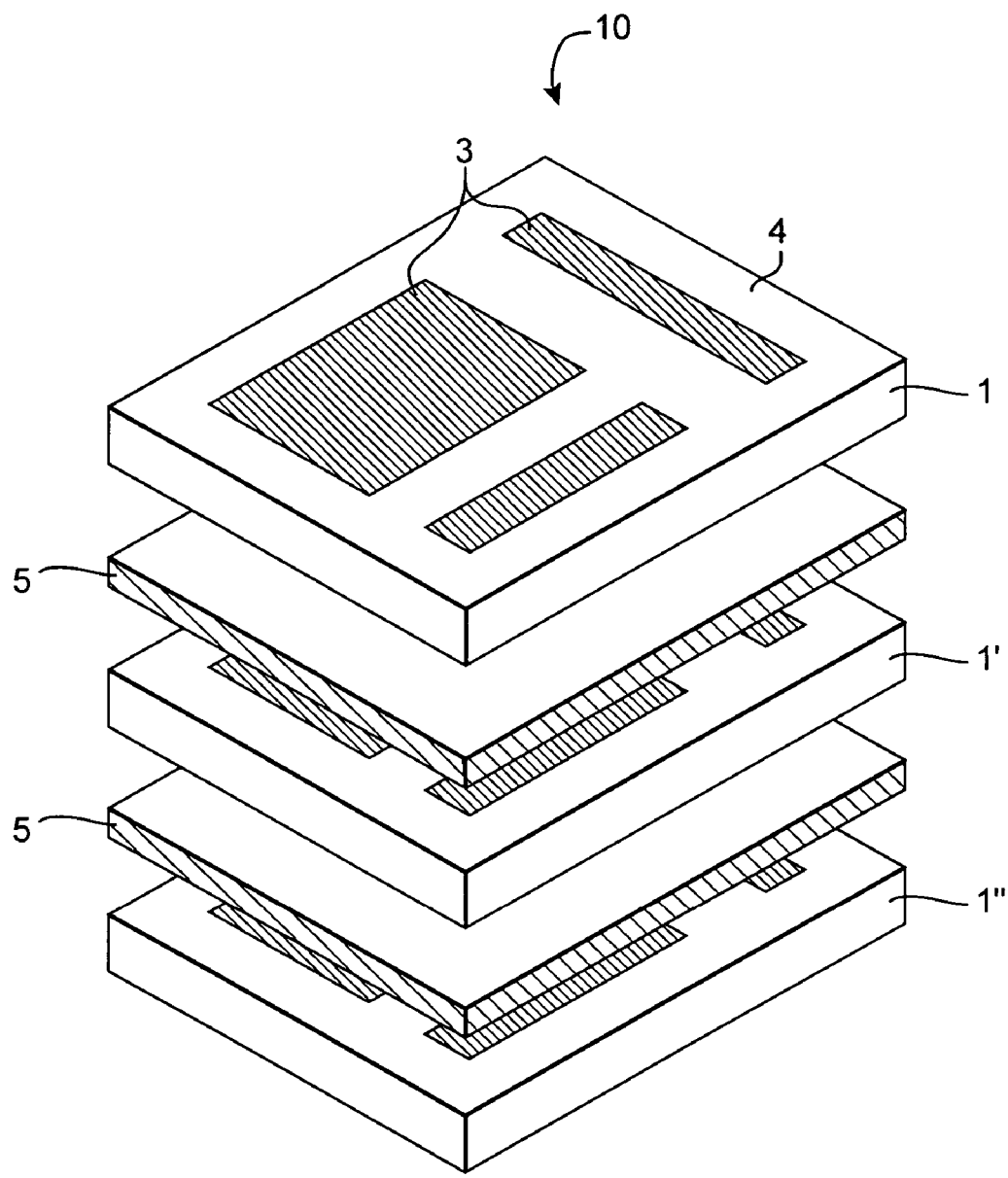
FIG. 2 shows, in an exploded view, an embodiment of the invention concerning a three-dimensional stack.

The method can thus be repeated a plurality of times, so as to produce a multi-level structure. As shown in FIG. 2, this structure 10 can, for example, consist of a stack of compounds 1, 1', 1", for example having similar shapes and or external sizes but of possibly different types, each capable of being secured to the preceding by molecular adhesion, on an $SiO_2$ coating layer 5 if the adhesion surface contains a polymer 4. One of the preferred three-dimensional structures 10 thus produced is designed so that each compound 1, 1', coated with a polymer 4 is totally coated with an $SiO_2$ layer 5 before being placed on this interface layer 5, which is a molecular adhesion layer, of the next component 1', 1".

The invention claimed is:

1. A method for molecular adhesion of a second electronic compound on a first electronic compound, comprising:
   coating a contact surface of the first electronic compound with a bonding layer; and
   molecularly adhering the second electronic compound to the bonding layer of the contact surface of the first electronic compound, wherein
   the contact surface of the first electronic compound comprises a hydrocarbon polymer, and
   at least some of the hydrocarbon polymer is coated with the bonding layer.

2. The method according to claim 1, further comprising:
   cleaning of a contact surface of the second electronic compound; and/or
   coating the contact surface of the second electronic compound with a bonding layer, wherein the bonding layer coating the contact surface of the second electronic compound is similar to the bonding layer coating the first electronic compound.

3. The method according to claim 1, further comprising thinning of the second electronic compound after adhesion thereof to the bonding layer.

4. The method according to claim 1, further comprising heat treating an assembly of the two compounds after adhesion.

5. The method according to claim 1, wherein a thickness of the coating produced by deposition of the bonding layer is between 50 and 300 nm.

6. The method according to claim 1 further comprising:
   polishing of the bonding layer; and/or
   activating the bonding layer, prior to the molecular adhesion.

7. The method according to claim 1, further comprising cross-linking of the polymer prior to the coating thereof.

8. The method according to claim 1, wherein the bonding layer consists of silicon oxide.

9. A method for producing an array of stacked electronic compounds comprising:
   applying the method of claim 1 to adhere at least one first electronic compound to at least one second electronic compound.

10. The method according to claim 1, wherein the coating is produced by deposition of a bonding layer made of silicon oxide having a thickness between 50 and 300 nm.

11. The method according to claim 10, further comprising:
    polishing and/or
    activating the silicon oxide layer.

12. The method according to claim 11, further comprising cross-linking of the polymer prior to the coating thereof.

13. A method for producing an array of stacked electronic compounds, comprising:
    applying the method of claim 10 to adhere at least one first electronic compound to at least one second electronic compound.

14. A three-dimensional array of electronic compounds comprising a plurality of interface layers, wherein each of the interface layers is at least equal to a surface of the array at the level of said interface layer, wherein at least some of the interface layers directly separate a hydrocarbon polymer from at least one electronic component.

15. The three-dimensional array according to claim 14, consisting of a stack of electronic compounds, wherein each compound has a same shape and/or size as an adjacent compound and each compound and adjacent compound are separated by an interface layer.

16. The three-dimensional array according to claim 14, wherein the interface layers consist of at least one material selected from the group consisting of silicon oxide, silicon nitride and silicon oxynitride.

17. A method for molecular adhesion of a second electronic compound on a first electronic compound, comprising:
    crosslinking a hydrocarbon polymer on a contact surface of the first electronic compound;

coating at least some of the contact surface of the first electronic compound with at least one material selected from the group consisting of silicon oxide, silicon nitride and silicon oxinitride polishing and/or activating the silicon layer; and molecularly adhering the second electronic compound to the contact surface of the first electronic compound.

18. The method according to claim 17, further comprising heat treating an assembly of the two electronic compounds after adhesion.

19. The method according to claim 18, further comprising thinning of the second electronic compound after adhesion thereof to the first electronic compound.

* * * * *